United States Patent
Adkisson et al.

(10) Patent No.: US 6,960,744 B2
(45) Date of Patent: Nov. 1, 2005

(54) ELECTRICALLY TUNABLE ON-CHIP RESISTOR

(75) Inventors: James W. Adkisson, Jericho, VT (US); Anthony Kendall Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 91 days.

(21) Appl. No.: 10/604,609

(22) Filed: Aug. 4, 2003

(65) Prior Publication Data

US 2005/0030149 A1 Feb. 10, 2005

(51) Int. Cl.[7] .................................................. H05B 1/02
(52) U.S. Cl. ........................................ 219/494; 219/501
(58) Field of Search ............................ 219/209, 210, 219/494; 338/7–10, 25

(56) References Cited

U.S. PATENT DOCUMENTS

| | | | | |
|---|---|---|---|---|
| 2,116,600 A | * | 5/1938 | Fisher et al. ................... 338/25 |
| 3,369,207 A | * | 2/1968 | Hasegawa et al. ............. 338/25 |
| 3,887,785 A | * | 6/1975 | Ahlport ....................... 219/209 |
| 4,449,032 A | * | 5/1984 | Frerking ...................... 219/210 |
| 4,592,665 A | * | 6/1986 | Wheable ...................... 374/143 |
| 5,334,880 A | | 8/1994 | Abadeer et al. ............. 307/219 |
| 5,635,893 A | | 6/1997 | Spraggins et al. ............ 338/48 |
| 5,837,884 A | * | 11/1998 | Kimura et al. ............. 73/25.04 |
| 5,960,014 A | | 9/1999 | Li et al. ........................ 372/20 |
| 2002/0162829 A1 | * | 11/2002 | Weber et al. ................ 219/209 |
| 2002/0179594 A1 | * | 12/2002 | Hada et al. .................. 219/494 |

FOREIGN PATENT DOCUMENTS

DE 3232169 * 3/1984
JP 610237050 * 10/1986

* cited by examiner

*Primary Examiner*—Tu Hoang
(74) *Attorney, Agent, or Firm*—Connolly Bove Lodge & Hutz LLP; Myron K. Wyche

(57) ABSTRACT

A device having a resistor and a heater disposed proximate to the resistor and capable of raising the temperature of the resistor. The device further includes a dielectric disposed between the heater and the resistor and a tuner electrically coupled to the resistor. The heater adjusts the resistance of the resistor in response to the tuner.

10 Claims, 10 Drawing Sheets

ELECTRICALLY TUNABLE ON-CHIP RESISTOR

BACKGROUND OF INVENTION

1. Technical Field

The technical field is resistors.

2. Related Art

Resistors are typically specified as having a nominal resistance, a room temperature resistance variation, and temperature coefficient of resistance. The temperature coefficient of resistance describes the variation in resistance of a resistor as a function of temperature change.

Integrated circuit performance depends upon the electrical characteristics of semiconductor devices in the circuit. One method for adjusting the electrical characteristics of a semiconductor device is by "trimming" one or more resistors in the device. Trimming of resistors can be done by chemical, mechanical, and electrical means. Conventional trimming methods involve heating a resistor to change electrical and physical properties of the resistor. Once a conventional resistor has been trimmed, however, its properties are fixed and cannot be changed once the semiconductor wafer carrying the circuit has been diced and packaged.

SUMMARY OF INVENTION

According to a first embodiment, a method of operating a resistor comprises providing a tuner that is electrically coupled to the resistor, detecting a resistance of the resistor, and adjusting the temperature of the resistor when the resistance of the resistor is outside a nominal resistance range. The temperature of the resistor may therefore be controlled while the resistor is in use, such as when the resistor is in use as a resistive element in a semiconductor circuit.

According to the first embodiment, the performance of a circuit incorporating the resistor is improved because the temperature, and therefore the resistance of the resistor is controlled.

Those skilled in the art will appreciate the advantages and benefits of various embodiments of the invention upon reading the following detailed description of the embodiments with reference to the below-listed drawings.

According to common practice, the various features of the drawings are not necessarily drawn to scale. Dimensions of various features may be expanded or reduced to more clearly illustrate the embodiments of the invention.

BRIEF DESCRIPTION OF DRAWINGS

The detailed description will refer to the following drawings, wherein like numerals refer to like elements, and wherein.

DETAILED DESCRIPTION

Figure 1:
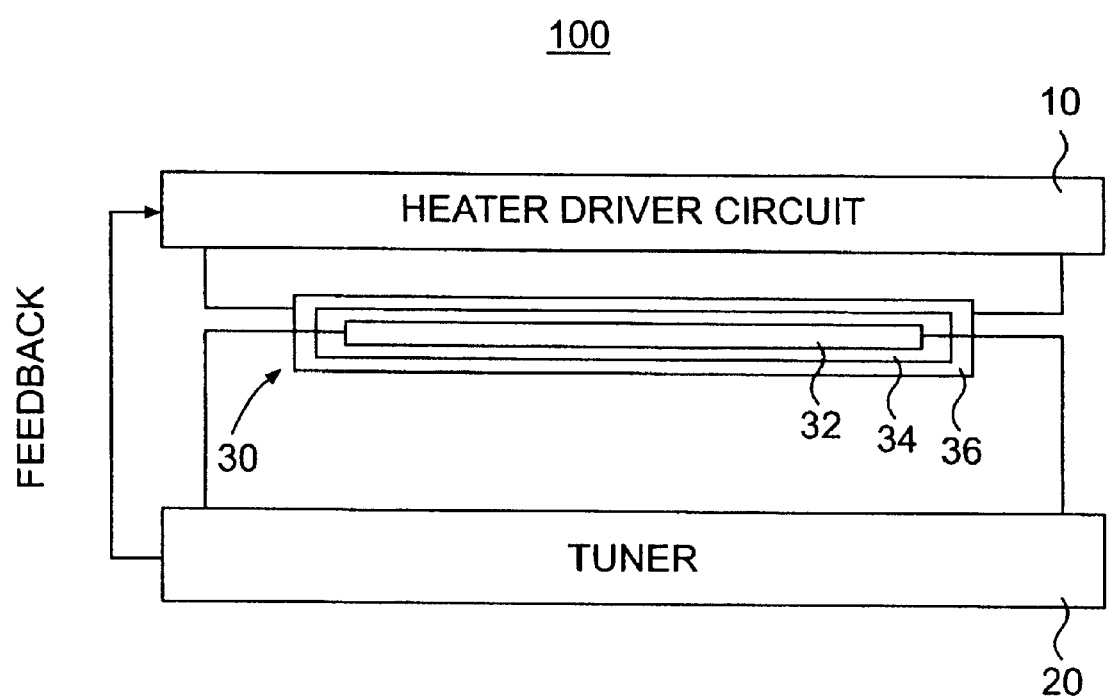
FIG. 1. is a schematic illustration of a system having a tunable resistor.

FIG. 1 is a schematic illustration of an embodiment of the invention. In FIG. 1, a resistor system 100 allows for tuning of a resistor 32. Specifically, the resistor 32 can be actively tuned while in use. The resistor system 100 may be formed on a structure such as, for example, a semiconductor chip. Other environments are also suitable.

The resistor system 100 comprises a heater driver circuit 10, a tuner 20, a resistor 32, a dielectric 34, and a heater 36. In general operation, the tuner 20 senses the resistance of the resistor 32, and determines the deviation of the sensed resistance from a nominal resistance or resistance range. The resistance range can be described as R±☐R. If the resistance of the resistor 32 is outside the nominal resistance range, the tuner 20 then provides feedback to the heater driver circuit 10, which adjusts the heat output of the heater 36. The heater 36 thereby changes the temperature of the resistor 32 until the tuner 20 detects a resistance for the resistor 32 that falls within the nominal resistance range. For the purposes of this specification, a "nominal resistance" is a subset of a "nominal resistance range", and the term "nominal resistance range" is used hereinafter to encompass both terms.

In a preferred embodiment, the heater 36 maintains the resistor 32 at an elevated temperature T. The elevated temperature T is initially selected to place the resistor 36 within the target resistance range R±☐R. The elevated temperature T should be selected to be sufficiently higher than an expected temperature of the environment, so that reducing the output of the heater 36 in effect results in cooling of the resistor 36. For example, in one embodiment, a resistor 32 is utilized in an environment where the temperature may be expected to stay at about 50° C. The elevated temperature T may therefore be selected as 70° C. The temperature of, and therefore the resistance of the resistor 32, can thus be adjusted either upwardly or downwardly by either increasing or decreasing the output of the heater 36.

The heater 36 can be a resistive element. Therefore, the heat output of the heater 36 can be easily regulated by changing a current I through the heater 36 during operation of the resistor 32. When a change of the resistance of the resistor 32 is warranted, the current I can be reduced or increased accordingly.

The resistance of the resistor 32 may be detected, for example, by including any known resistance sensing device in the tuner 20. For example, one method of detecting the resistance of the resistor 32 is to pass a calibration current through the resistor 32. The resistance can also be detected by detecting an oscillation frequency f in a device incorporating the resistor 32. Other methods may also be used to detect resistance. As an alternative to detecting resistance, a temperature sensing device (not illustrated) can be connected to the resistor 32, or generally located in the vicinity of the resistor 32. The temperature sensing device can be used to determine what temperature correction is needed to place the resistor 32 within a nominal resistance range. The temperature sensing device may be, for example, a discrete or integrated thin film thermocouple.

The resistor 32 may be an "on chip" resistor, and the resistor system 100 may be fabricated over the silicon area of a semiconductor chip. In contrast to conventional resistor trimming processes, the resistor 36 may be adjusted during operation of the chip. Conventional trimming processes occur before a chip is diced and packaged. The embodiments of the present invention allow for adjustment of resistance after a chip is diced and packaged. FIGS. 2A–9 illustrate further aspects of the present invention, and are discussed in detail below.

Figure 2A:
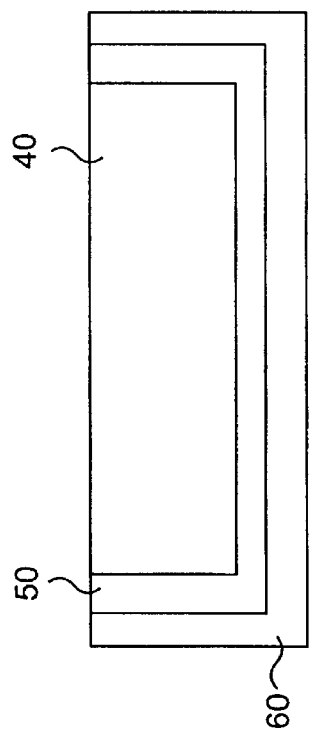
FIGS. 2A is a top plan view of an embodiment of a tunable resistor.
Figure 2B:
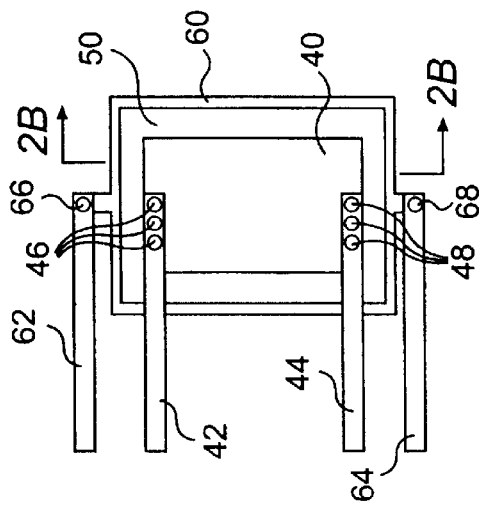
FIG. 2B is a section view taken on line 2B—2B in FIG. 2A.

FIGS. 2A and 2B illustrate an embodiment of a tunable resistor 40 and associated elements. FIG. 2A is a top plan view, and FIG. 2B is a section view taken on line 2B—2B. FIGS. 2A and 2B generally illustrate an embodiment of the resistor 40 as formed by a damascene process. A dielectric 50 separates the resistor 40 from a heater 60. In FIGS. 2A and 2B, the resistor 40 is disposed within the dielectric 50, which is in turn disposed within the heater 60.

The heater 60 is attached to conductive leads 62, 64 at contacts 66, 68, respectively. The conductive leads 62, 64 may be electrically connected to a heater driver circuit (not illustrated), such as the circuit 10 illustrated in FIG. 1. The heater driver circuit provides a heating current to the heater 60. The heater 60 may comprise, for example, a resistive element that generates heat when a current passes therethrough. The leads 62, 64 may extend "vertically" (a direction perpendicular to the page in FIG. 2A) to contact the heater 60. Conductive leads 42, 44 may similarly extend vertically to contact the resistor 40. Multiple contacts 46, 48 may be used. The leads 42, 44 may be connected to a tuner (not illustrated), such as the tuner 20 illustrated in FIG. 1. The nature of the leads 42, 44, 62, 64 is illustrated in FIGS. 4A–4D and is discussed in detail below.

Figure 3A:
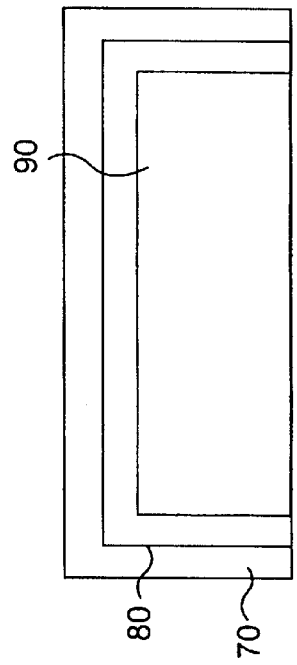
FIG. 3A is a top plan view of an alternative embodiment of a tunable resistor.
Figure 3B:
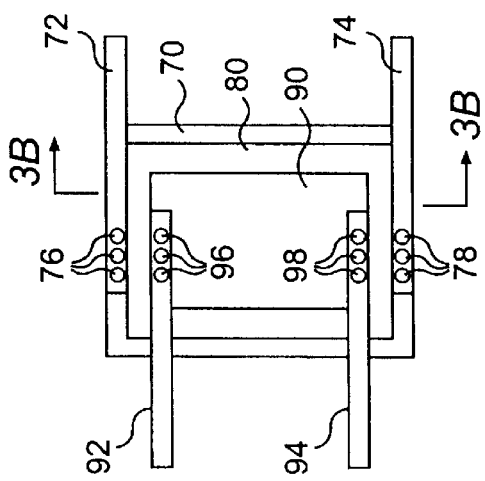
FIG. 3B is a section view taken on line 3B—3B in FIG. 3A.

FIGS. 3A and 3B illustrate another embodiment of a tunable resistor 90 and associated elements. FIG. 3A is a top plan view, and FIG. 3B is a section view taken on line 3B—3B. FIGS. 3A and 3B generally illustrate an embodiment of the resistor 90 as formed by a subtractive etch process. The resistor 90 is disposed in a dielectric 80, which separates the resistor 90 from a heater 70.

The heater 70 is attached to conductive leads 72, 74 at contacts 76, 78, respectively. The conductive leads 72, 74 may be electrically connected to a heater driver circuit (not illustrated), such as the heater driver circuit 10 illustrated in FIG. 1. The heater driver circuit provides heating current to the heater 70. The conductive leads 72, 74 may extend vertically (a direction into the page in FIG. 3A) to contact the heater 70. Leads 92, 94 may similarly extend vertically to contact the resistor 90. Multiple contacts 96, 98 may be connected to the leads 92, 94. The leads 92, 94 may be connected to a tuner (not illustrated), such as the tuner 20 illustrated in FIG. 1. The nature of the leads 72, 74, 92, 94 is illustrated in FIGS. 4A–4D and is discussed in detail below.

The above resistor embodiments can be partially or fully enclosed (not illustrated in FIGS. 2A–3B) within a dielectric material. An example of this configuration is illustrated in FIGS. 4A–4D.

Figure 4A:
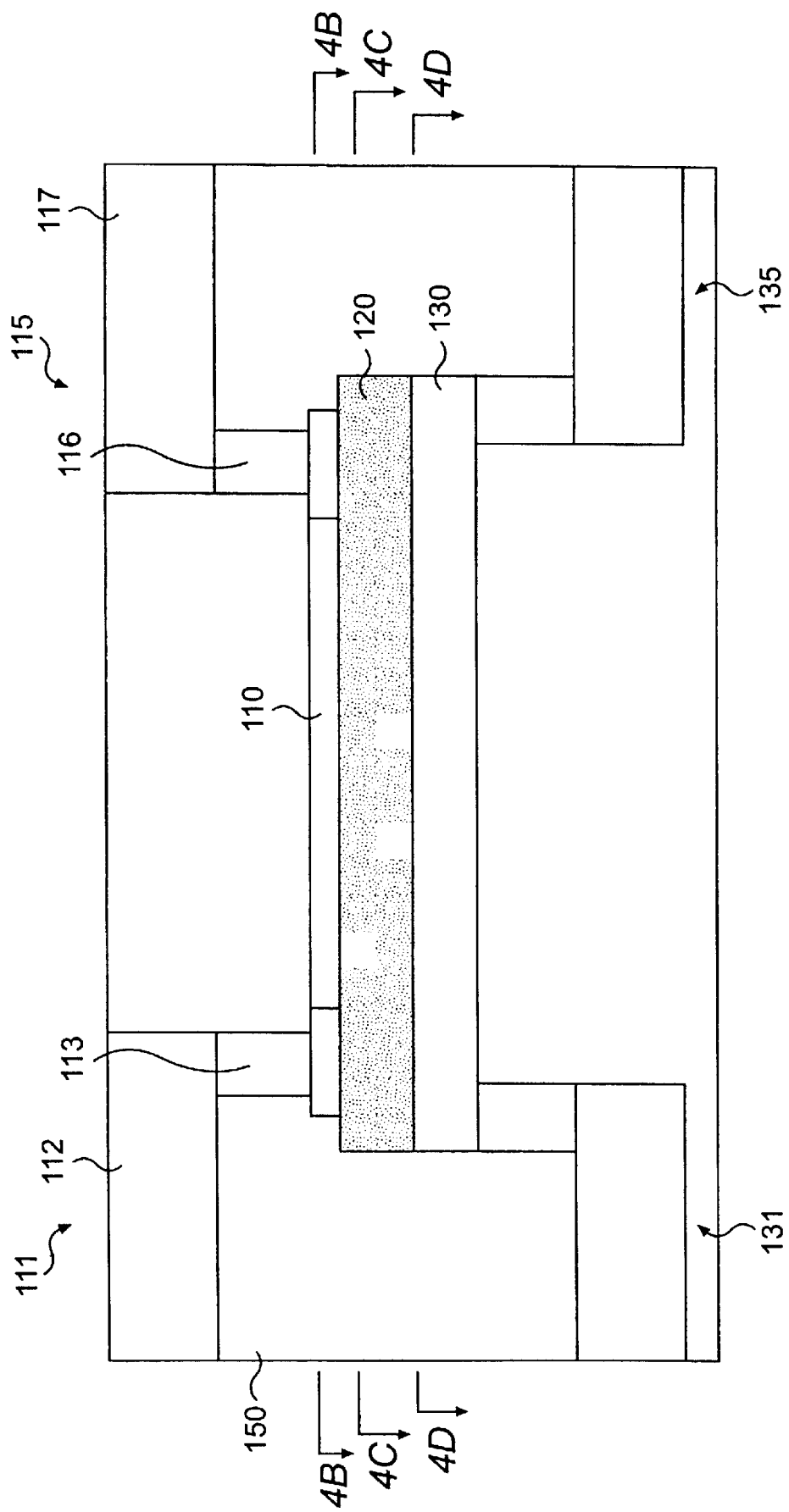
FIG. 4A is a section view illustrating a tunable resistor encased in dielectric material.
Figure 4B:
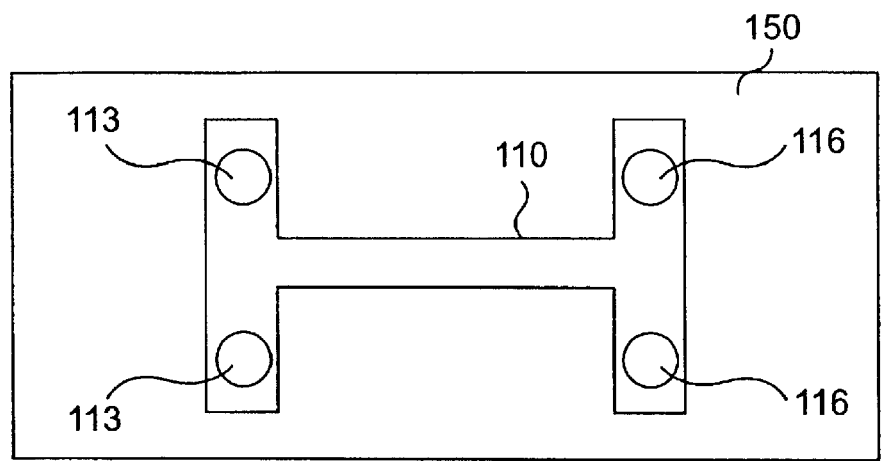
FIG. 4B is a section view taken on line 4B—4B in FIG. 4A.
Figure 4C:
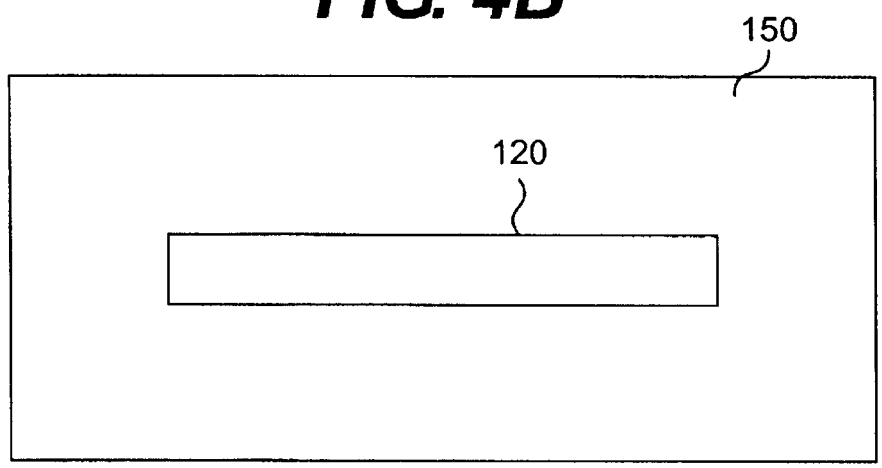
FIG. 4C is a section view taken on line 4C—4C in FIG. 4A.
Figure 4D:
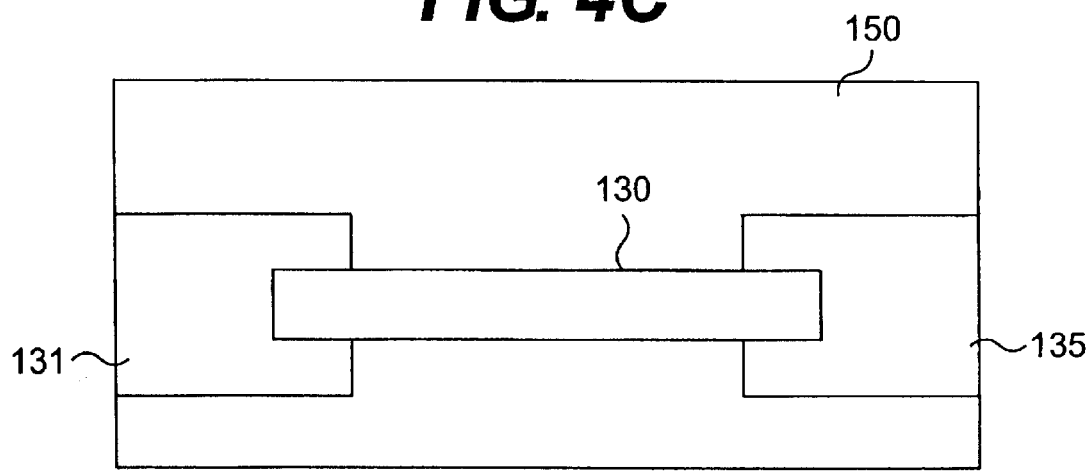
FIG. 4D is a section view taken on line 4D—4D in FIG. 4A.

FIGS. 4A–4D illustrate an embodiment of a tunable resistor and associated elements enclosed in a dielectric material. FIG. 4A is a section view in front elevation, and FIGS. 4B, 4C, and 4D are section views taken on lines 4B—4B, 4C—4C, and 4D—4D, respectively. In FIG. 4A, a resistor 110 is disposed over a dielectric 120, which is disposed over a heater 130. The resistor 110, the dielectric 120, and the heater 130 are encased in dielectric material 150. The dielectric material 150 can be formed from, for example, one or more layers or bodies of dielectric material.

In FIG. 4A, portions of conductors 111, 115 extend "vertically" downwardly through the dielectric material 150 to contact the resistor 110. The conductors 111, 115, may be connected to a tuner (not illustrated), such as the tuner 20 illustrated in FIG. 1. Portions of conductors 131, 135 extend upwardly through the material 150 and contact the heater 130. The conductors 131, 135 supply heating current to the heater 130. The conductors 131, 135 may be connected to a heater driver circuit (not illustrated), such as the heater driver circuit 10 illustrated in FIG. 1.

The conductor 111 is illustrated as formed by a wire 112 and a via 113. The via 113 can be formed in the dielectric material 150 by etching through the material 150 and subsequently metallizing the through hole. The wire 112 can be formed by, for example, damascene or subtractive etch processes. The conductor 115 is similarly comprised of a via 116 and a wire 117. There may be two each of the vias 113, 116 (only one of each via is visible in FIG. 4A). The conductors 131, 135 may have similar configurations.

FIG. 4B illustrates the resistor 110 in plan view. As shown in FIG. 4B, the vias 113, 116 (each one associated with a conductor) contact the resistor 110. The vias 113, 116 can be used to connect the resistor 110 to a tuner, and/or to any number of additional components in an integrated circuit.

As shown in FIG. 4C, the dielectric 120 can have a plan view footprint that substantially conforms in shape and size to that of the heater 130. The dielectric 120 can also be of any other shape, size or thickness that prevents electrical contact between the resistor 110 and the heater 130.

Referring to FIG. 4D, the heater 130 may have a simple metallic strip configuration that conforms generally in shape to the resistor 110. As is also shown in FIG. 4A, the heater 130 is connected to the conductors 131, 135.

The dielectric material 150 may have both electrical and thermal insulation properties. Thermal insulative properties are desirable because the heater 130 and the resistor 110 will generate heat during use, which may affect the operation of components near to the resistor 110. The use of dielectrics which are poor thermal conductors is particularly advantageous when the tunable resistor 110 is formed on a semiconductor chip. Examples of materials suitable for forming the dielectric material 150 include polyarylene ether (available under the trade name DOW CHEMICAL SILK), FLAIR manufactured by Honeywell, spin-on methyl silsexquoixane (MSQ), hygrogen silsexquoixane (HSQ), silica aerogels, $SiC_xO_yH_z$, $SiO_2$, and FSG.

The dielectric material 150 may be formed by, for example, PECVD, HDP CVD, thermal CVD, spin-on processes, and lamination pressing of dielectric laminate layers. The embodiments illustrated in FIGS. 2A–3B may also be encased in dielectric material in a manner similar to the embodiment illustrated in FIGS. 4A–4D.

The dielectric 120 preferably has relatively high thermal conductivity. High thermal conductivity in the material 120 allows heat from the heater 130 to more effectively heat the resistor 110. Examples of dielectric materials with suitable thermal conductivity properties include silicon dioxide (SiO$_2$) and alumina (Al$_2$O$_3$). These materials are also suitable to form the dielectrics 34, 50 and 80 illustrated in FIGS. 1–3B.

The heaters discussed above may be resistive elements that produce heat when a current passes therethrough. The heaters may be formed from, for example, refractory metals such as tantalum, tantalum nitride, tungsten, tungsten nitride, TiAl$_3$ and TiN. The heaters may also be formed from thin layers of high conductivity materials such as copper and aluminum. The heaters may be formed by any suitable method, such as, for example, chemical vapor deposition (CVD) and sputtering.

The resistors in the above embodiments can be formed from any materials that are suitable for forming resistors. Such materials include, for example, conductors and semiconductors. If a linear or approximately linear coefficient of resistance is desired, then metals, including the refractory metals discussed above, are desirable. If a nonlinear coefficient of resistance is desired, semiconductors such as, for example, doped silicon and germanium are suitable. Materials such as bismuth and antimony are also suitable semiconductors. The resistors can be formed by methods such as, for example, chemical vapor deposition and sputtering.

Figure 5:
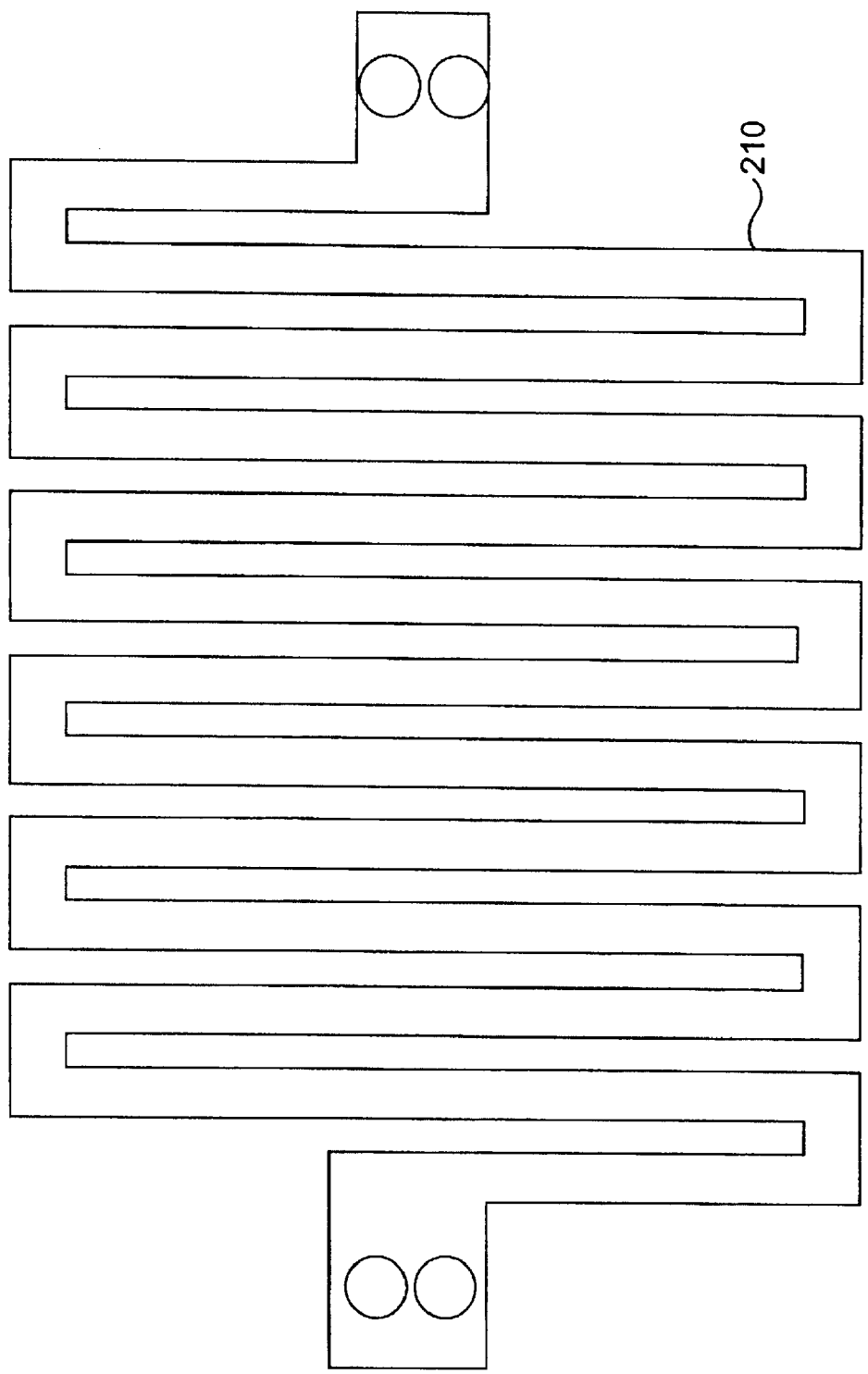
FIG. 5 is a plan view of alternative resistor configuration.

The resistors illustrated in FIGS. 2A–4D are relatively simple in configuration. Other resistor types and configurations can be made tunable according to the principles of the present invention. For example, FIG. 5 illustrates a serpentine resistor 210 in isolation. The serpentine resistor 210 can be placed proximate to a heater (not shown) in a manner similar to the embodiments discussed above.

Tuners used in the above embodiments may be any device that is capable of sensing resistances. Analog devices are examples of suitable tuners. The tuner may also be a mechanical device. Heater driver circuits used in the above embodiments may be, for example, current sources. A tuner and a heater can be part of a single component or circuit, or located at different points in an integrated circuit.

As discussed above, the resistors according to the embodiments of the present invention can be actively tuned while the resistors are in use. For example, the resistor may be coupled to other circuit components on a semiconductor chip and serve as a resistive element of the chip, while the temperature and therefore the resistance of the resistor are actively monitored and controlled. The performance of the circuit incorporating the resistor may therefore be improved because the resistance of the resistor may be maintained within a nominal range.

The above methods discuss active tuning of resistors while the resistors are in use. In an alternative embodiment, a one-time adjustment can be made to a resistor after the chip is diced and packaged. This embodiment is described below using the schematic embodiment shown in FIG. 1 as an example.

Referring to FIG. 1, the resistance of the resistor 32 is sensed after a chip housing the resistor 32 is diced and packaged. The heater 36 can elevate the temperature of the resistor 32 by a certain value before the resistance is sensed.

The tuner 20 then determines the deviation of the resistance of the resistor 32 from a nominal resistance range. At this time, the heater driver circuit 10 may be permanently adjusted so that it generates a current that will to bring the resistor 32 into the desired resistance range. The heater driver circuit 10 can be adjusted by, for example, blowing one or more fuses in the heater driver circuit 10 to establish a constant current from the heater driver circuit 10. Examples of suitable fuses include laser fuses and antifuses.

Figure 6A:
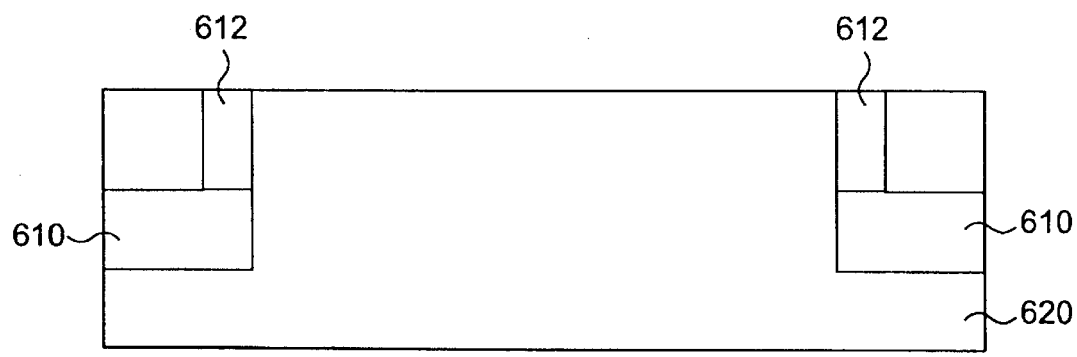
FIGS. 6A–6D illustrate a subtractive etch method for manufacturing a tunable resistor.

FIGS. 6A–6D illustrate a subtractive etch method for manufacturing a tunable resistor. FIG. 6A is a sectional view of a first stage of manufacture. In FIG. 6A, wires 610 and vias 612 are fabricated. The wires 610 and vias 612 can be formed in dielectric material 620 using known methods such as subtractive etch or damascene processes. The wires 610 can be formed from, for example, a refractory metal lined with a metal such as copper or aluminum.

Figure 6B:
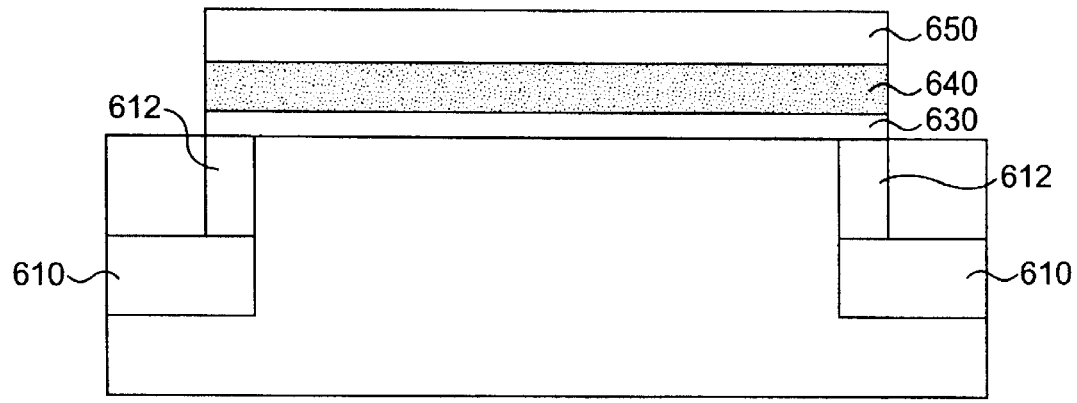

Referring to FIG. 6B, three layers (not shown in FIG. 6B), including a heater conductor layer, a high thermal conductivity insulative material, and a resistive layer are deposited over the dielectric 620. These layers are then patterned using lithography and etched to form a heater 630, a dielectric 640, and a resistor 650.

Figure 6C:
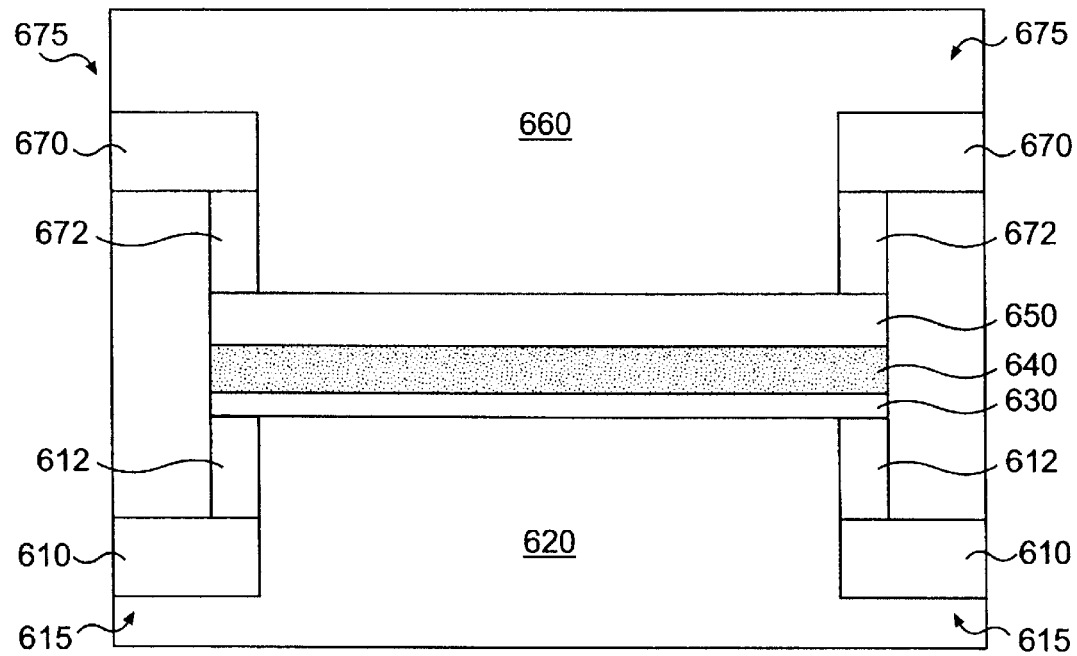

Referring to FIG. 6C, additional dielectric material is formed over the article shown in FIG. 6B, resulting in dielectric material 660. Wires 670 and vias 672 are formed in the dielectric material 660. The wires 610 and vias 612 form conductors 615, and the wires 670 and vias 672 form conductors 675. The dielectric 640 preferably has relatively high thermal conductivity, and the dielectric materials 620, 660 preferably have relatively low thermal conductivity, as discussed above. The dielectric materials 620, 660 can be formed from, for example, one or more layers or bodies of dielectric material.

Figure 6D:
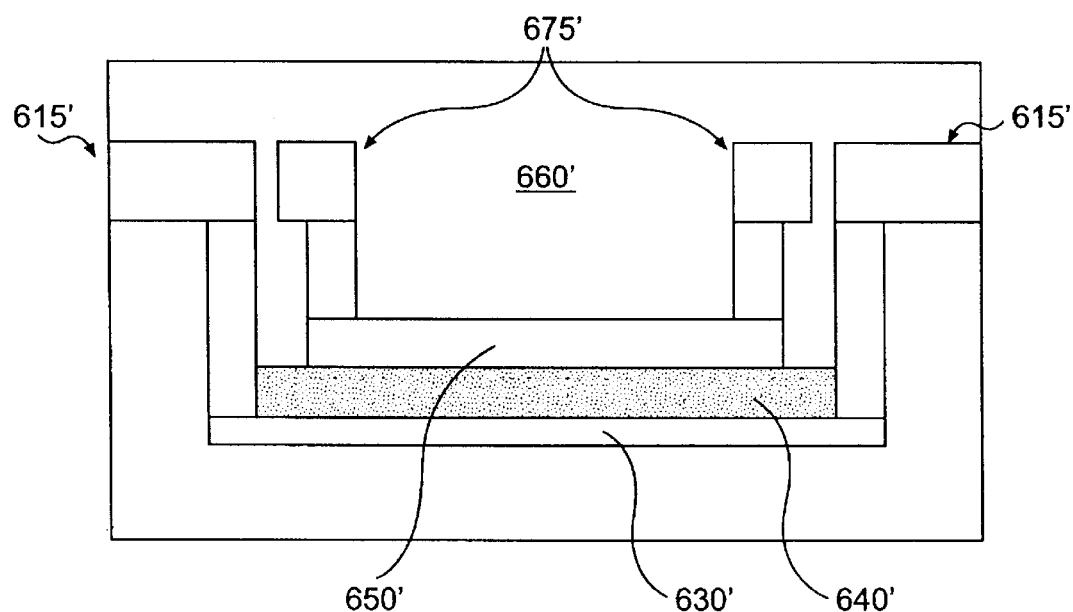

FIG. 6D illustrates an alternative subtractive etch fabrication method. The embodiment illustrated in FIG. 6D is similar to that of FIG. 6C, and like reference numbers indicate like elements. In FIG. 6D, a heater 630' and a dielectric 640' are formed by patterning and etching, and a resistor 650' is patterned afterwards. The resistive layer used to form the resistor 650' can be deposited after forming the heater 630' and the dielectric 640'.

Figure 7A:
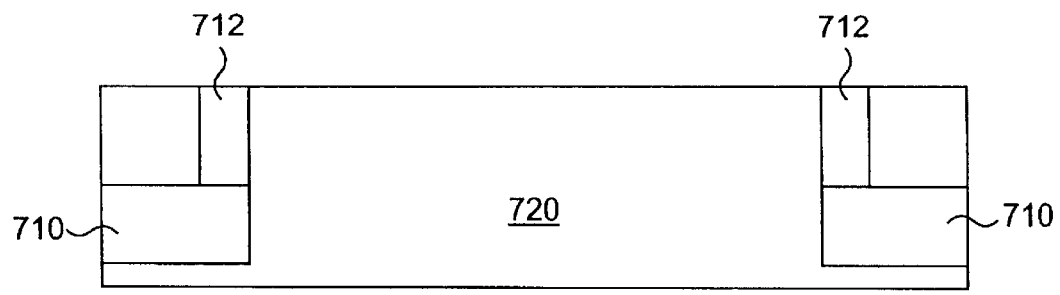
FIGS. 7A–7E illustrate a damascene process for manufacturing a tunable resistor.

FIGS. 7A–7D illustrate a damascene method for manufacturing a tunable resistor. FIG. 7A is a sectional view of a first stage of manufacture. In FIG. 7A, wires 710 and vias 712 are fabricated. The wires 710 and the vias 712 can be formed in a dielectric material 720 using methods such as subtractive etch or damascene processes. The wires 710 can be formed from, for example, a refractory metal lined with a metal such as copper, aluminum, tungsten or doped silicon.

Figure 7B:
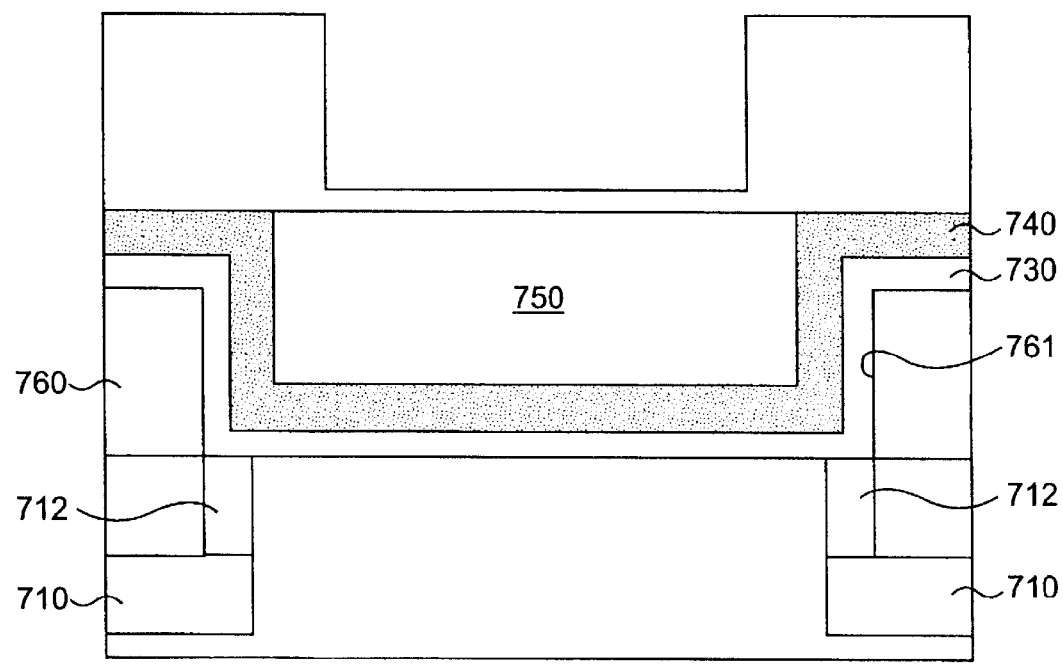

Referring to FIG. 7B, an intermetal dielectric (not shown in FIG. 7B), such as SiLK™ is deposited. The intermetal dielectric is then patterned and etched to form an intermetal dielectric 760 having a trench 761. Three layers, including a heater conductor layer 730, a high thermal conductivity insulative material layer 740, and a resistive layer 750 are deposited over the intermetal dielectric 760.

Figure 7C:
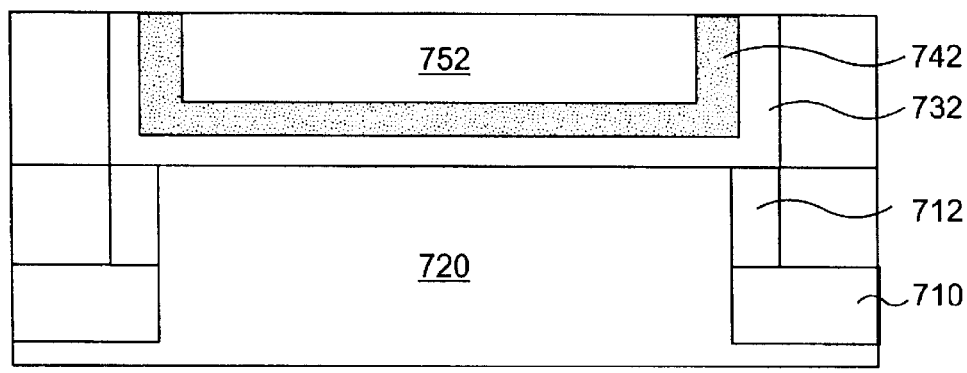
Figure 7D:
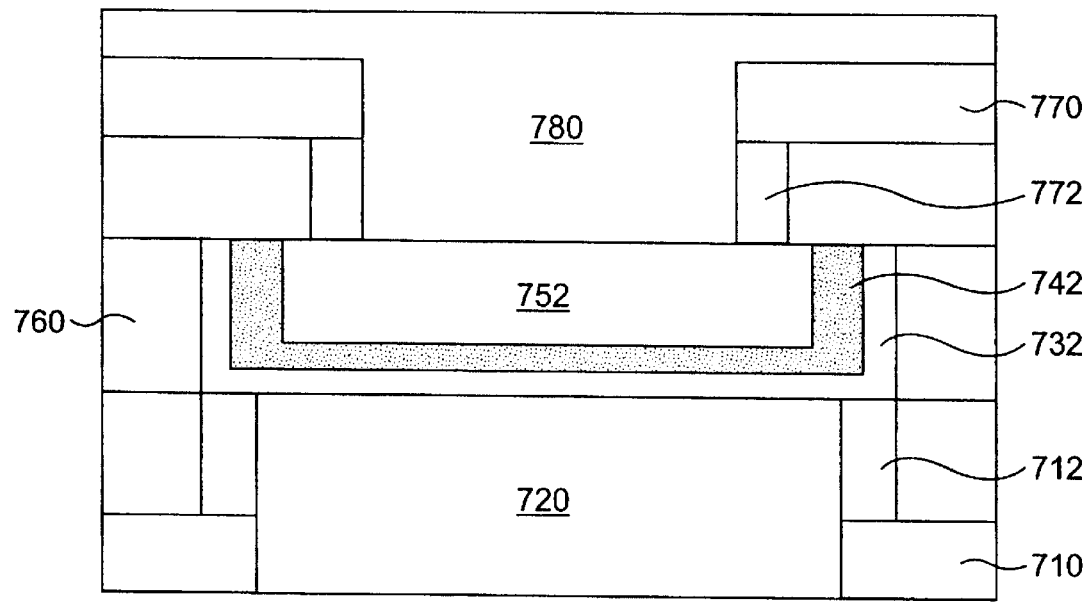

Referring to FIG. 7C, excess material is then removed from the wafer surface, leaving a heater 732, a dielectric 742, and a resistor 752. Referring to FIG. 7D, wires 770 and vias 772 are formed in a dielectric material 780 to connect to the resistor 752. The dielectric materials 720, 780 can be formed from, for example, one or more layers or bodies of dielectric material.

Figure 7E:
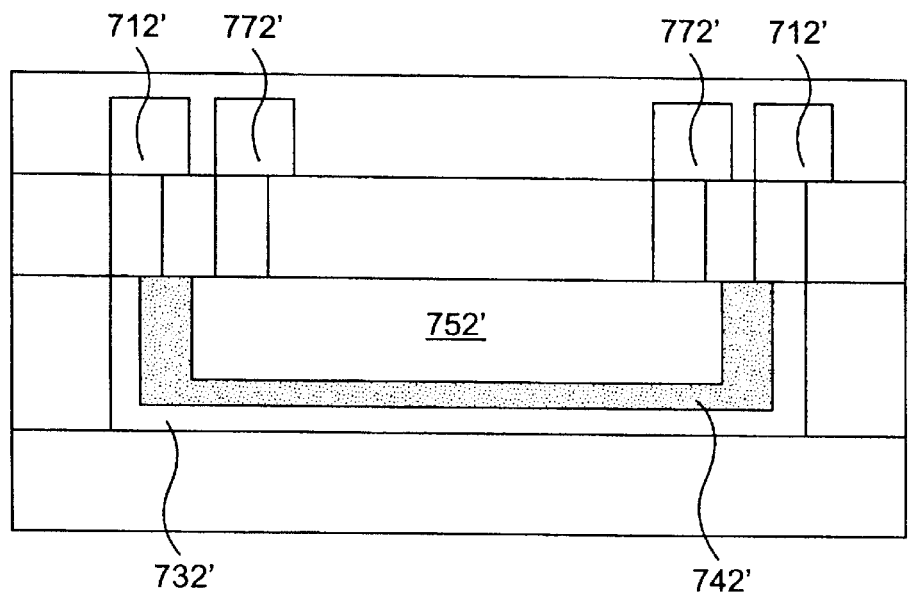

FIG. 7E illustrates an alternative embodiment in which conductors 772' connect to the top of a resistor 752', and conductors 712' connect to the top of a heater 732'. A dielectric 742' is disposed between the resistor 752' and the heater 732'. The conductors 712', 772' are illustrated as comprising a via and wire portion.

Figure 8:
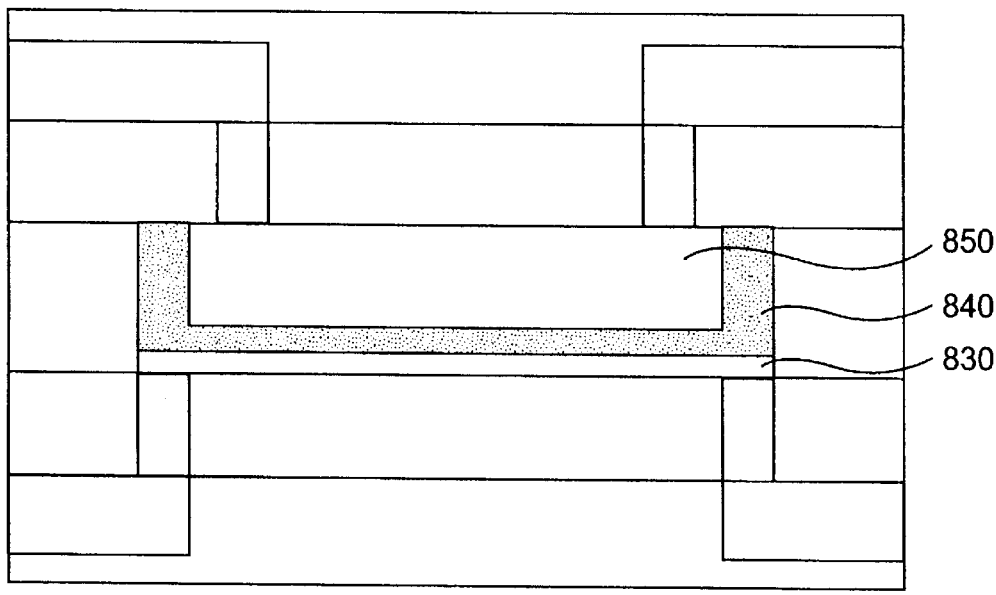
FIG. 8 illustrates a hybrid subtractive etch/damascene process for manufacturing a tunable resistor.

FIG. 8 illustrates a hybrid method involving damascene and subtractive etch processes. In FIG. 8, a heater 830 is formed using subtractive etch processes. A dielectric 840 and a resistor 850 are formed using damascene processes. Alternatively, a heater and a dielectric can be formed using subtractive etch processes, and a resistor formed using damascene processes (not shown).

In another alternative embodiment, a heater can be formed using damascene processes and a dielectric and a resistor can be formed using subtractive etching (not shown). In yet another embodiment, the heater can be formed using damascene processes and the resistor can be fabricated using subtractive etching (not shown).

Figure 9:
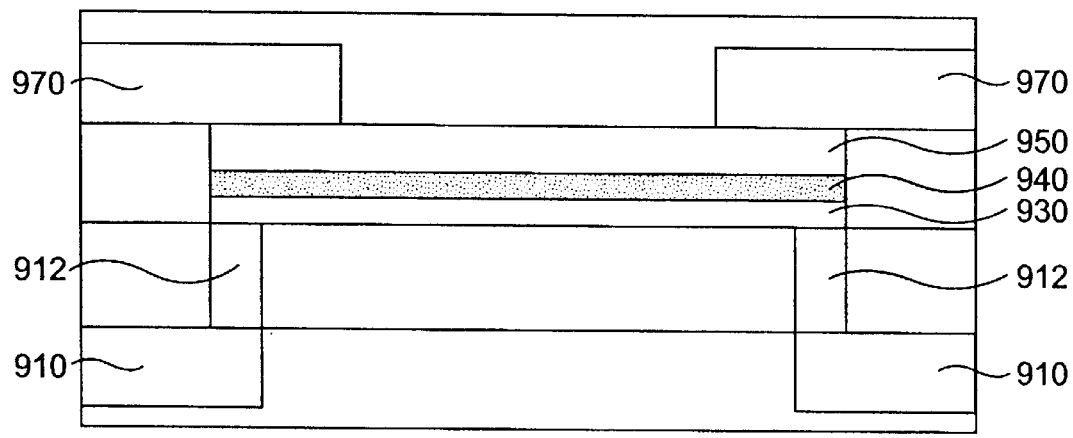
FIG. 9 illustrates an alternative tunable resistor embodiment.

FIG. 9 illustrates an embodiment in which a resistor 950 contacts wires 970. The wires 970 can be formed using, for example, subtractive etch or damascene processes. A heater 930 is illustrated as connected to wires 910 by way of vias 912.

In the above embodiments, the heater and resistor locations may be switched.

In the above embodiments, wires formed by damascene processes can be formed by single damascene processes (as shown) or by dual damascene processes.

In this specification, the terms "vertically", "downwardly" and "upwardly" are used to describe elements in relation to the drawing figures, and are not intended to impart any required orientation on any elements described herein.

The resistors and the associated materials and circuitry discussed above may be formed in many environments. Examples of suitable environments include over the silicon area of semiconductor chips, by fabrication as thin films on glass quartz substrates, in semiconductor packages, on $Al_2O_3$ substrates, and on sapphire substrates.

The heaters and resistors in the above embodiments can be of any dimensions suitable for incorporation in the environment utilized. Examples of heater thicknesses include a range of about 0.1 micrometers to 5 micrometers, and heater widths may be in the range of about 0.1 micrometers to about 10 mm. In one embodiment, a resistor has a thickness of 0.5 micrometers and a width of 5 micrometers. Examples of resistor thicknesses include a range of about 2 nanometers (nm) to about 0.1 micrometers. One resistor embodiment has a thickness of 50 nm. Resistor width may be the same or similar to heater width.

In an alternative embodiment, a separate heater is not required to heat a resistor. In this embodiment, a DC current is applied directly to the resistor in order to heat the resistor.

The foregoing description of the invention illustrates and describes the present invention. Additionally, the disclosure shows and describes only selected preferred embodiments of the invention, but it is to be understood that the invention is capable of use in various other combinations, modifications, and environments and is capable of changes or modifications within the scope of the inventive concept as expressed herein, commensurate with the above teachings, and/or within the skill or knowledge of the relevant art.

The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments, not explicitly defined in the detailed description.

We claim:

1. A device, comprising:

a resistor;

a heater disposed proximate to the resistor and capable of raising the temperature of the resistor;

a dielectric disposed between the heater and the resistor; and a tuner electrically coupled to the resistor, wherein the heater adjusts the resistance of the resistor in response to the tuner, the resistor, the heater and the dielectric are at least partially disposed within a dielectric material, and the thermal conductivity of the dielectric is higher than that of the dielectric material.

2. The device of claim 1, further comprising: a heater driver circuit electrically coupled to the heater and to the tuner, wherein the heater driver circuit supplies a heating current to the heater.

3. The device of claim 2, wherein: the tuner transmits an output signal to the heater driver circuit when the temperature of the resistor is outside a nominal temperature range.

4. The device of claim 1, wherein: the resistor, the heater, and the tuner are disposed on a semiconductor wafer.

5. The device of claim 1, wherein the dielectric is $Al_2O_3$.

6. The device of claim 1, wherein the dielectric material is at least one polyarylene ether, spin-on methyl silsexquoixane, hydrogen silsexquoixane and silica aerogels.

7. The device of claim 1, wherein: the dielectric material substantially encases the resistor, the heater and the dielectric.

8. The device of claim 1, wherein the heater maintains the resistor at an elevated temperature while the resistor is in use.

9. The device of claim 1, further comprising: one or more conductors extending through the dielectric material and contacting the resistor, wherein the conductors couple the resistor to the tuner.

10. A semiconductor chip comprising the device recited in claim 1.

* * * * *